United States Patent [19]
Runaldue

[11] Patent Number: 5,160,860
[45] Date of Patent: Nov. 3, 1992

[54] INPUT TRANSITION RESPONSIVE CMOS SELF-BOOST CIRCUIT

[75] Inventor: Thomas J. Runaldue, San Jose, Calif.

[73] Assignee: Advanced Micro Devices, Inc., Sunnyvale, Calif.

[21] Appl. No.: 760,414

[22] Filed: Sep. 16, 1991

[51] Int. Cl.[5] .............................. H03K 19/94
[52] U.S. Cl. ..................... 307/482; 307/443; 307/578
[58] Field of Search ............ 307/264, 443, 451, 481, 307/482, 449, 578

[56] References Cited

U.S. PATENT DOCUMENTS

| | | | |
|---|---|---|---|
| 3,579,275 | 5/1971 | Polkinghorn et al. | 307/481 |
| 3,995,171 | 11/1976 | Sonoda | 307/578 |
| 4,381,460 | 4/1983 | Menachem | 307/449 |
| 4,692,638 | 9/1987 | Stiegler | 307/578 |
| 4,811,304 | 3/1989 | Matsuda et al. | 307/449 |

OTHER PUBLICATIONS

De Simone, R. R.; "Low-Power MOSFET Decoder", IBM Tech. Discl. Bull.; vol. 13, No. 1, pp. 260-261; Jun. 1970.
Dockerty; R. C. and R. W. Krepper; "Enhancement/Depletion Decoder Circuit", IBM Tech. Discl. Bull.; vol. 19, No. 5, pp. 1681-1682, Nov. 1976.

Primary Examiner—Edward P. Westin
Assistant Examiner—Benjamin D. Driscoll
Attorney, Agent, or Firm—Davis Chin

[57] ABSTRACT

A CMOS self-boost circuit inclused a pull-up N-channel transistor (MN1), a self-capacitance (SC), an N-channel gating transistor (MN2), a pull-up P-channel transistor (MP1), and a pulse circuit (18). The pulse circuit is formed of the delay network and a NAND logic gate (ND1). The pulse circuit is responsive to an input control signal making a low-to-high transition for generating a pulse signal. The gate of the pull-up P-channel transistor (MP1) is responsive to the pulse signal for pulling up initially the gate of the pull-up N-channel transistor (MN1) close to an upper power supply potential, thereby rendering greater conduction of the pull-up N-channel transistor (MN1) to provide a higher output voltage corresponding to a high logic state.

12 Claims, 2 Drawing Sheets

INPUT TRANSITION RESPONSIVE CMOS SELF-BOOST CIRCUIT

BACKGROUND OF THE INVENTION

This invention relates generally to semiconductor integrated circuits formed of CMOS technology and more particularly, it relates to an improved self-boost circuit which has a faster speed of operation and has a higher logic "1" output voltage level than has been traditionally available.

It is often necessary and/or desirable to operate different parts of an electronic system at different voltage levels. At the places where the different parts interface, they must be coupled to each other. However, the signals at the interfaces are not necessarily compatible. It is therefore at times necessary to provide interface and driver output buffer circuits so as to render one part of the system to be compatible with another part, such as is required when driving large loads. Typically, such driver output buffer circuits include a pull-up device connected between an upper power supply potential VDD and an output node and a pull-down device connected between a lower power supply potential VSS and the output node. Sometimes, a P-channel device is provided so as to function as the pull-up device for generating a high output voltage level $V_{OH}$ corresponding to the high logic level.

However, in applications which require high drive capability the P-channel pull-up devices have been replaced with N-channel devices because their intrinsic mobility is more than twice than that of the P-channel device. With its greater mobility, the N-channel device is twice as conductive as compared to the P-channel device of an equal size. Due to its greater conduction, the N-channel device will have only half of the impedance between the drain terminal and the source terminal than an equivalent P-channel device. When such N-channel devices are utilized as the pull-up devices, they operate like source followers. In other words, the source electrode of the N-channel devices will attempt to follow the voltage at its gate electrode. The only disadvantage in using the N-channel devices is that the source electrode can only be pulled up to a voltage which is a threshold drop below the gate voltage.

In FIG. 1, there is shown a conventional source follower circuit 2 which includes an N-channel pull-up transistor MN1. The drain of the transistor MN1 is connected to an upper power supply potential VDD, which is approximately +5.0 volts. The gate of the transistor MN1 is connected to an input node 4 for receiving an input control signal ENHIGH. The source of the transistor MN1 is connected to an output node 6 for providing an output. As is generally well-known in CMOS digital integrated circuits, the input control signal ENHIGH has normal logic levels which are (1) a low or "0" logic state represented by a lower power supply potential VSS and (2) a high or "1" logic state represented by the upper power supply potential VDD. The lower power supply potential VSS is usually connected to an external ground or 0 volts. Thus, if the gate voltage on the node 4 is restricted to operate within the CMOS (0 to +5.0 volts) range then the N-channel source follower circuit can only pull up the output node 6 to a voltage of +5.0 volts minus a threshold voltage $V_{Tn}$ or approximately +3.5 volts. The voltage $V_{Tn}$ is the body-effect enhanced threshold of the N-channel transistor MN1 which is variable dependent upon the operating voltage of the source electrode relative to the voltage applied to the substrate.

This threshold voltage can be fixed by connecting the N-channel substrate to the source electrode. However, this technique is only permitted in CMOS technologies in which the N-channel devices have isolated p-well substrates. It will be noted that if it is desired to adhere to TTL output logic levels then the conventional source follower circuit 2 is quite adequate since the output node 6 needs to be pulled up only to the voltage of approximately +2.4 volts. On the other hand, if higher output voltage levels are required, i.e., CMOS logic levels of 0 to +5.0 volts, then either the gate voltage must be increased or the threshold voltage must be reduced. Since the reduction of the device threshold voltage will have an adverse effect on other circuits, this procedure is usually never performed.

There has been attempted in the prior art of increasing the gate voltage by utilizing a gate boosting circuit 8 as illustrated in FIG. 2. The boosting circuit 8 includes an additional second N-channel transistor MN2. The transistor MN2 has its gate connected to the upper power supply potential VDD and its source connected to the input node 4 for receiving the input control signal ENHIGH. The drain of the transistor MN2 is connected to the gate (node NUP) of the N-channel pull-up transistor MN1. A sel.-capacitance SC, defining a parasitic capacitance, is connected between the gate node NUP and the output node 6. The transistor MN2 provides isolation between the input control signal ENHIGH and the gate node NUP when the signal ENHIGH is asserted (a high logic level).

As the input control signal ENHIGH is making the low-to-high transition, the transistor MN2 does not turn off until the input control signal ENHIGH reaches approximately +3.5 volts due to again the body-effect threshold. At this point, the self-capacitance pushes the gate node NUP higher as the voltage on the source of the transistor MN1 rises, which is actually when the boosting effect begins. Accordingly, this self-boosting circuit 8 having a starting voltage of approximately +3.5 volts suffers from the disadvantage of providing a voltage rise at the gate node NUP which is actually slower than the input control signal ENHIGH provided to the gate of the conventional source follower circuit 2 of FIG. 1. Therefore, while the boosting circuit 8 will generate a higher final output voltage level corresponding to the high logic level, it has a slower speed of operation.

It would therefore be desirable to provide an improved self-boost circuit which not only provides a higher logic "1" output voltage level but also has a faster switching speed. The present self-boost circuit represents an improvement over the conventional self-boosting circuit of FIG. 2.

SUMMARY OF THE INVENTION

Accordingly, it is a general object of the present invention to provide an improved self-boost circuit which is relatively simple and economical to manufacture and assemble, but yet overcomes the disadvantages of the prior art self-boosting circuits.

It is an object of the present invention to provide a CMOS self-boost circuit which has faster speed of operation and has a higher logic "1" output voltage level than has been traditionally available.

It is another object of the present invention to provide a CMOS self-boost circuit which is formed of a first pull-up device, a gating device, a self-capacitance, a second pull-up device, and a pulse circuit.

In accordance with these aims and objectives, the present invention is concerned with the provision of a CMOS self-boost circuit which has a faster speed of operation and has a higher output voltage level corresponding to a high logic state which includes an input node, a pull-up N-channel transistor, a self-capacitance, an N-channel gating transistor, a pull-up P-channel transistor, a NAND logic gate, and a delay element. The input node receives an input control signal swinging between a lower power supply potential corresponding to a low logic level and an upper power supply potential corresponding to a high logic level. The pull-up N-channel transistor has its drain connected to the upper power supply potential, its gate connected to a gate node and its source connected to an output node. The self-capacitance is connected across the gate and the drain of the pull-up N-channel transistor. The N-channel gating transistor has its drain-source conduction path connected between the gate node and input node and its gate connected to the upper power supply potential.

The pull-up P-channel transistor has its source connected to the upper power supply potential, its gate connected to a pull-down node and its drain connected to the gate node. The NAND logic gate has a first input, a second input, and an output. The first input of the NAND logic gate is connected to the input node, and the output of the NAND logic gate is connected to the pull-down node. The delay element is interconnected between the input node and the second input of the NAND logic gate for delaying the input control signal.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
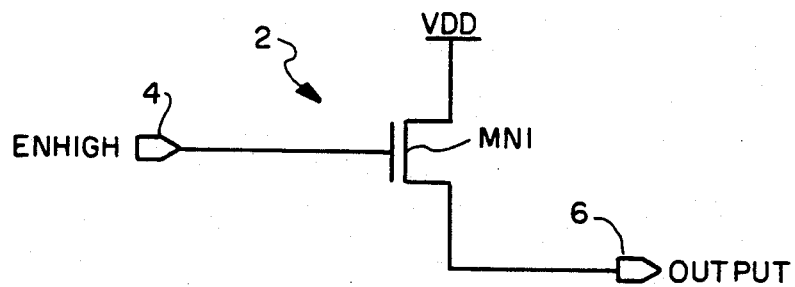
FIG. 1 is a schematic diagram of a conventional source follower circuit.

Referring now in detail to the drawings, there is shown a schematic diagram of a CMOS self-boost circuit 10, constructed in accordance with the principles of the present invention. The CMOS self-boost circuit 10 includes a first pull-up device 12, a gating device 14, a self-capacitance SC, a second pull-up device 16, and a pulse circuit 18. The present self-boost circuit provides not only faster switching times, but also provides for a higher conduction on the first pull-up device 12 so as to generate a higher output voltage level $V_{OH}$ corresponding to the high logic level.

The first pull-up device 12 is formed of a relatively large size N-channel MOS transistor MN1 which has a high drive capability. The pull-up transistor MN1 has its drain connected to an upper supply potential VDD, which is typically at +5.0 volts, and its source connected to an output node 20. The gate of the transistor MN1 is connected to a node generally designated as NUP. A self-capacitance SC has its one end connected to the node NUP (gate of transistor MN1) and its other end connected to the output node 20 (source of transistor MN1). It should be noted that a pull-down device (not shown) is typically connected between the output node 20 and the lower power supply potential VSS. However, the pull-down device has been purposely omitted for the sake of clarity since it does not form a part of the present invention.

The gating device 14 is formed of a relatively small size N-channel MOS transistor MN2 which has one of its conduction path electrodes connected to the gate node NUP and has the other one of its conduction path electrodes connected to an input node 22. The input node 22 receives an input control signal ENHIGH. The gate of the transistor MN2 is connected to the upper power supply potential VDD.

The second pull-up device 16 is formed of a relatively small size P-channel MOS transistor MP1 which is similar to the size of the transistor MN2. The transistor MP1 has its source connected to the upper power supply potential VDD and its drain connected to the gate node NUP. The gate of the transistor MP1 is connected to a pull-down node designated generally as PD1.

The pulse circuit 18 consists of a delay network formed of first, second and third inverters I1 through I3 and a NAND logic gate ND1. The first inverter I1 has its input connected to a first input of the NAND logic gate ND1 on line 24 and to the input node 22 for receiving the input control signal ENHIGH. The control signal ENHIGH varies between a logic "0" level, which is essentially at the lower power supply potential or ground VSS, and a logic "1" level, which is essentially at the upper power supply potential VDD. The second inverter I2 has its input connected to the output of the first inverter I1 and its output connected to the input of the third inverter I3. The output of the third inverter I3 is connected to a second input of the NAND logic gate ND1 on line 26. The output of the NAND logic gate ND1 is also connected to the pull-down node PD1.

Figure 3:
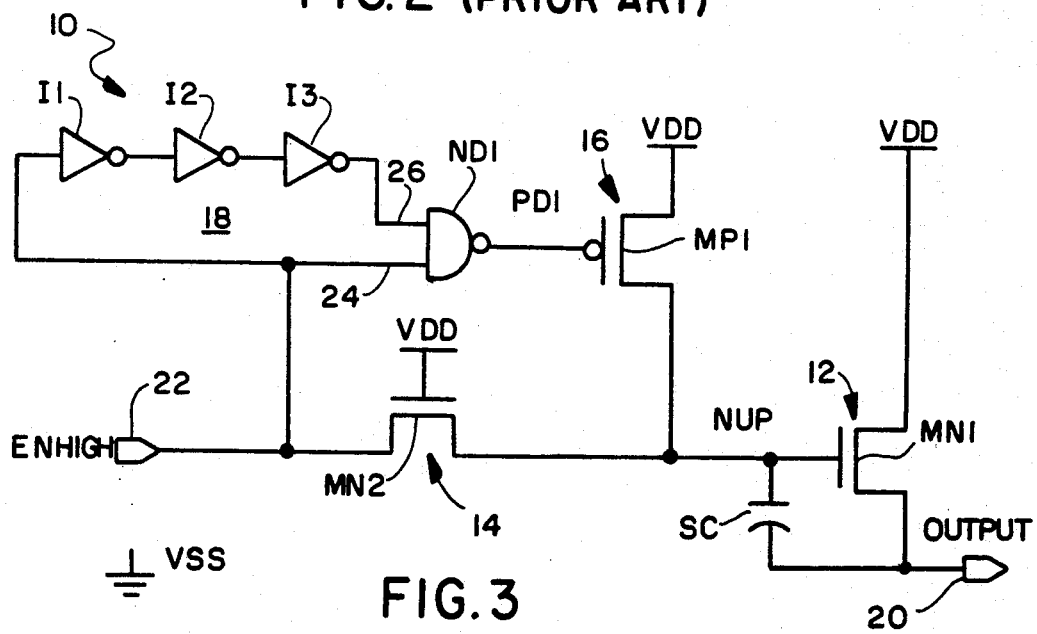
FIG. 3 is a schematic diagram of a CMOS self-boost circuit, constructed in accordance with the principles of the present invention.
Figure 6:
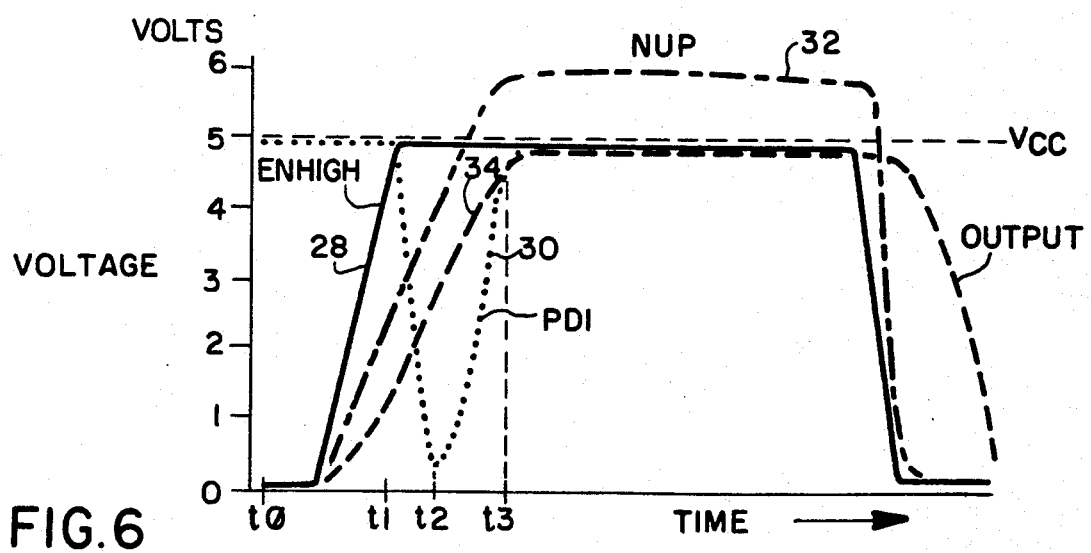
FIG. 6 are waveforms at various points in the circuit of FIG. 3.

The pull-up action of operation of the CMOS self-boost circuit of FIG. 3 will now be explained with reference to the waveforms of FIG. 6. Initially, it will be assumed that the input control signal ENHIGH is at a low logic level at time tφ and that the pull-up transistors MN1 and MP1 are both turned off. Consequently, the output signal on the output node 20 will be at the low logic level. With the control signal ENHIGH being in the low logic level at the time tφ, the first input of the gate ND1 on the line 24 will be at the low logic level and the second input of the gate ND1 on the line 26 will be at the high logic level. Therefore, the output of the gate ND1 will be at the high logic level. Further, the gating transistor MN2 with its source (input node 22) at the ground potential VSS and its gate at the upper power supply potential VDD conducts in the common source mode and clamps the gate node NUP close to the ground potential VSS, thereby maintaining the pull-up transistor MN1 to be non-conductive.

When the control signal ENHIGH (curve 28) makes a low-to-high transition at the time t1, the inverters I1 through I3 functioning as a delay element will maintain for a short time line 26 to be at the high logic level. With the line 24 going to the high logic level, this causes the output of the gate ND1 or the pull-down node PD1 (curve 30) to go to a low logic level. As a result, the second pull-up transistor MP1 will be turned on momentarily, thereby causing the gate node NUP (curve 32) to be pulled up at the time t2 to nearly the upper power supply potential VDD. The output node 20 (curve 34) will follow the gate node NUP since the transistor MN1 with its drain (input node 22) at the upper power supply potential VDD and its gate also connected to VDD conducts in the source follower mode.

As the input control signal ENHIGH being in the high logic level propagates through the inverters I1 through I3, the second input of the gate ND1 on the line 26 will eventually go to the low logic level. This will cause the output of the gate ND1 (curve 30) to return to the high logic level at the time t3, which will in turn render the second pull-up transistor MP1 to be non-conductive. As can be seen, between the times t2 and t3, the output voltage (curve 34) on the source of the first pull-up transistor MN1 is rising and due to the self-capacitance SC the gate node NUP (curve 32) is pushed higher than the upper supply potential VDD.

It will be understood by those skilled in the art that if the output of the gate ND1 did not turn off the second pull-up transistor MP1 then the self-boosting effect would be lost since there would be provided a continuous conduction path through the transistor MP1 to the upper power supply potential VDD. Further, it will be noted that the gate node NUP is clamped to a voltage equal to a diode drop above the upper power supply potential VDD due to an inherent parasitic diode created between the drain and substrate (which is tied to VDD) of the pull-up transistor MP1.

Figure 2:
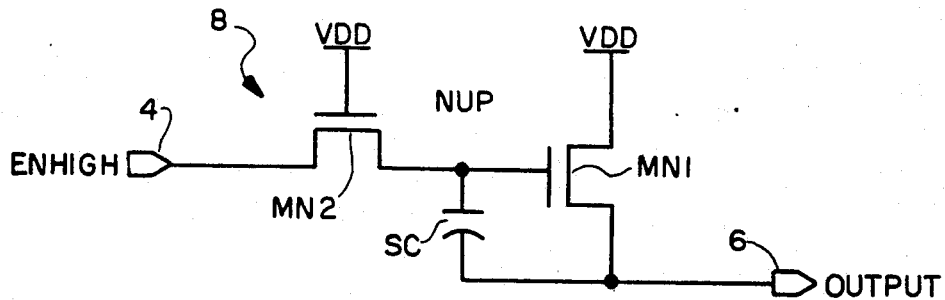
FIG. 2 is a schematic diagram of a conventional self-boosting circuit.
Figure 4:
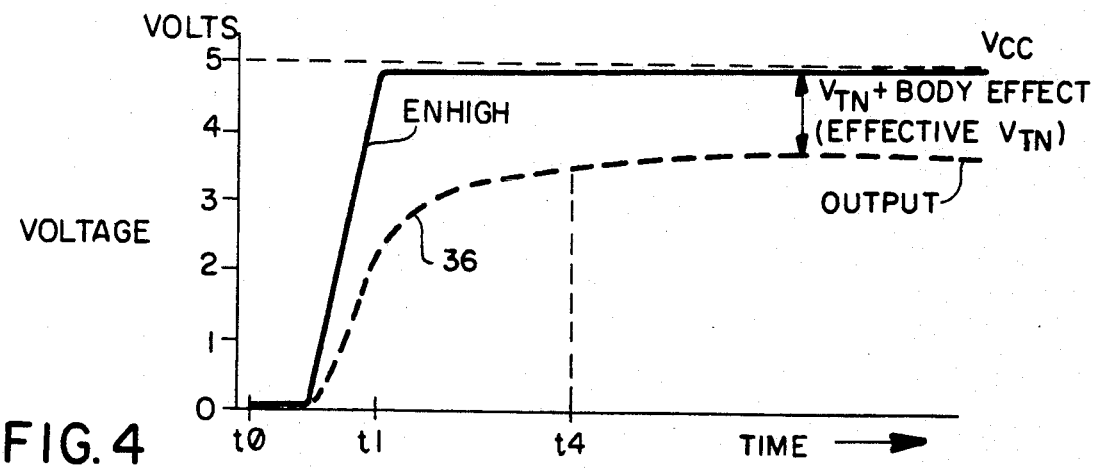
FIG. 4 are waveforms at various points in the circuit of FIG. 1.
Figure 5:
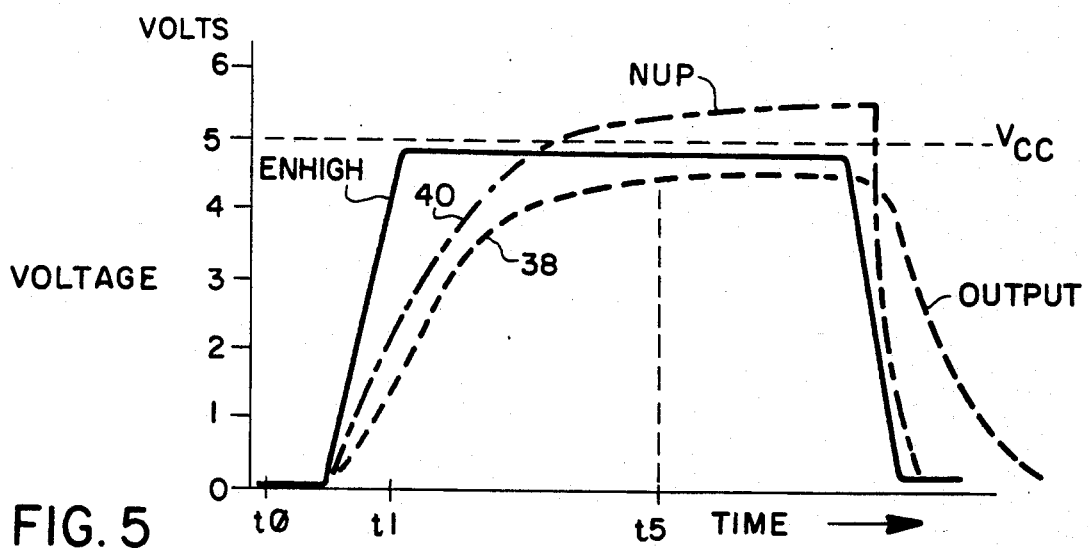
FIG. 5 are waveforms at various points in the circuit of FIG. 2.

In this manner, the CMOS self-boost circuit of the present invention provides faster rise times for the higher gate voltage at the node NUP and a final higher output voltage of approximately +5.0 volts corresponding to the high logic level at the time t3. Specifically, by comparing the output curve 34 of FIG. 6 with the respective output curve 36 of FIG. 4 (corresponding to the circuit of FIG. 1) and curve 38 of FIG. 5 (corresponding to the circuit of FIG. 2), it can be seen that the output voltage in FIG. 4 reaches only about 3.5 volts at a longer time t4 and that the output voltage in FIG. 5 reaches only about +4.5 volts at a longer time t5. In addition, the rise time for the curve 32 (gate node NUP) in FIG. 6 is much faster than the rise time for the curve 40 in FIG. 5.

It should be understood that each of the inverters I1 through I3 is preferably formed of a CMOS inverter having a P-channel MOS transistor and an N-channel MOS transistor whose gates are connected together defining its input and whose drains are connected together defining its output. Further, while the delay network in FIG. 3 has been shown as being made up of a plurality of three inverters it should be noted that a single inverter could be used instead. Alternatively, a delay network may be formed of any odd number of series-connected inverters as desired so as to vary the amount of delay time.

From the foregoing detailed description, it can thus be seen that the present invention provides an improved self-boost circuit which has a faster speed of operation and has a higher logic "1" output voltage level. The first pull-up device, a gating device, a self-capacitance, a second pull-up device, and a pulse circuit. The pulse circuit is formed of a delay network and a NAND logic gate.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A CMOS self-boost circuit which has a faster speed of operation and has a higher output voltage level corresponding to a high logic state, comprising:
   an input node (22) for receiving an input control signal (ENHIGH) swinging between a lower power supply potential (VSS) corresponding to a low logic level and an upper power supply potential (VDD) corresponding to a high logic level;
   a pull-up N-channel transistor (MN1) having its drain connected to said upper power supply potential (VDD), its gate connected to a gate node (NUP) and its source connected to an output node (20);
   a self-capacitance (SC) connected across said gate and said source of said pull-up N-channel transistor (MN1);
   an N-channel gating transistor (MN2) having its drain-source conduction path connected between said gate node (NUP) and said input node (22) and its gate connected to said upper power supply potential (VDD);
   a pull-up P-channel transistor (MP1) having its source connected to said upper power supply potential (VDD), its gate connected to a pull-down node (PD1) and its drain connected to said gate node (NUP);
   a NAND logic gate (ND1) having a first input, a second input and an output, the first input of said NAND logic gate being connected to said input node (22), the output of said NAND logic gate being connected to said pull-down node (PD1); and
   delay means interconnected between said input node (22) and the second input of said NAND logic gate for delaying said input control signal.

2. A CMOS self-boost circuit as claimed in claim 1, wherein said delay means comprises at least one inverter having its input connected to said input node (22) and its output connected to said second input of said NAND logic gate (ND1).

3. A CMOS self-boost circuit as claimed in claim 1, wherein said delay means is comprised of first, second and third inverters (I1, I2, I3), said first inverter (I1) having its input connected to said input node (22) and its output connected to the input of said second inverter (I2), said third inverter (I3) having its input connected to the output of said second inverter (I2) and its output connected to said second input of said NAND logic gate (ND1).

4. A CMOS self-boost circuit as claimed in claim 1, wherein said delay means is comprised of any odd number of series-connected inverters.

5. A CMOS self-boost circuit as claimed in claim 1, wherein when said input control signal makes a low-to-high transition the output of said NAND logic gate causes said pull-up P-channel transistor (MP1) to turn on momentarily so as to pull-up initially gate node (NUP) close to said upper power supply potential (VDD), thereby rendering greater conduction of said pull-up N-channel transistor (MN1) to provide the higher output voltage at the output node (20).

6. A CMOS self-boost circuit as claimed in claim 1, wherein said pull-up P-channel transistor (MP1) and said gating transistor (MN2) are relatively smaller in size than said pull-up N-channel transistor (MN1).

7. A CMOS self-boost circuit as claimed in claim 5, wherein said gate node (NUP) is pushed subsequently to a voltage that is higher than said upper power supply potential (VDD) due to its self-capacitance (SC), and wherein the voltage at said output node (20) is raised close to said upper power supply potential (VDD).

8. A CMOS self-boost circuit which has a faster speed of operation and has a higher output voltage level corresponding to a high logic state, comprising:
an input node (22) for receiving an input control signal (ENHIGH) swinging between a lower power supply potential (VSS) corresponding to a low logic level and an upper power supply potential (VDD) corresponding to a high logic level;
a pull-up N-channel transistor (MN1) having its drain connected to said upper power supply potential (VDD), its gate connected to a gate node (NUP) and its source connected to an output node (20);
a self-capacitance (SC) connected across said gate and said source of said pull-up N-channel transistor (MN1);
an N-channel gating transistor (MN2) having its drain-source conduction path connected between said gate node (NUP) and said input node (22) and its gate connected to said upper power supply potential (VDD);
a pull-up P-channel transistor (MP1) having its source connected to said upper power supply potential (VDD), its gate connected to a pull-down node (PD1) and its drain connected to said gate node (NUP);
pulse circuit means (18) responsive to said input control signal making a low-to-high transition for generating a pulse signal; and
the gate of said pull-up P-channel transistor (MP1) being responsive to said pulse signal for pulling up initially said gate node (NUP) close to said upper power supply potential (VDD) in order to cause greater conduction of said pull-up N-channel transistor (MN1) so as to provide the higher output voltage at the output node (20).

9. A CMOS self-boost circuit as claimed in claim 8, wherein said pulse circuit means (18) includes logic gating means having a first input, a second input and an output, the first input of said logic gating means being connected to said input node (22), the output of said logic gating means being connected to said pull-down node (PD1), and inverter means interconnected between said input node (22) and the second input of said logic gating means for delaying said input control signal.

10. A CMOS self-boost circuit as claimed in claim 9, wherein said inverter means is comprised of first, second and third inverters (I1, I2, I3), said first inverter (I1) having its input connected to said input node (22) and its output connected to the input of said second inverter (I2), said third inverter (I3) having its input connected to the output of said second inverter (I2) and its output connected to said second input of said logic gating means.

11. A CMOS self-boost circuit as claimed in claim 8, wherein said pull-up P-channel transistor (MP1) and said gating transistor (MN2) are relatively smaller in size than said pull-up N-channel transistor (MN1).

12. A CMOS self-boost circuit as claimed in claim 8, wherein said gate node (NUP) is pushed subsequently to a voltage that is higher than said upper power supply potential (VDD) due to its self-capacitance (SC), and wherein the voltage at said output node (20) is raised close to said upper power supply potential (VDD).

* * * * *

UNITED STATES PATENT AND TRADEMARK OFFICE
CERTIFICATE OF CORRECTION

PATENT NO. : 5,160,860
DATED : November 3, 1992
INVENTOR(S) : Thomas J. Runaldue It is certified that error appears in the above-indentified patent and that said Letters Patent is hereby corrected as shown below:

On the Title page, item [57], Abstract, line 1, "inclused", should be --includes--.

Column 2, line 28, "sel.", should be --self--.

Column 6, line 4, after "The", insert --self-boost circuit of the present invention includes a --.

Signed and Sealed this

Twenty-eighth Day of September, 1993

Attest:

BRUCE LEHMAN

Attesting Officer

Commissioner of Patents and Trademarks